(12) United States Patent
Gu et al.

(10) Patent No.: US 10,539,629 B2
(45) Date of Patent: *Jan. 21, 2020

(54) PROGRAMMABLE ALTERNATING CURRENT (AC) LOAD HAVING REGENERATIVE AND DISSIPATIVE MODES

(71) Applicant: The Boeing Company, Chicago, IL (US)

(72) Inventors: Dazhong Gu, Elmhurst, NY (US); Dariusz Czarkowski, S. Setauket, NY (US); Francisco de Leon, Ridgewood, NJ (US); Kamiar J. Karimi, Kirkland, WA (US); Eugene V. Solodovnik, Lake Stevens, WA (US); Shengyi Liu, Sammamish, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/222,144

(22) Filed: Dec. 17, 2018

(65) Prior Publication Data
US 2019/0120913 A1 Apr. 25, 2019

Related U.S. Application Data

(63) Continuation of application No. 14/528,474, filed on Oct. 30, 2014, now Pat. No. 10,184,990.

(51) Int. Cl.
*G01R 31/42* (2006.01)
(52) U.S. Cl.
CPC .................................. *G01R 31/42* (2013.01)

(58) Field of Classification Search
None
See application file for complete search history.

(56) References Cited

U.S. PATENT DOCUMENTS

| | | | |
|---|---|---|---|
| 5,642,275 A | 6/1997 | Peng et al. | |
| 7,405,553 B1 | 7/2008 | Kattoju | |
| 10,184,990 B2 * | 1/2019 | Gu | G01R 31/42 |
| 2008/0312855 A1 | 12/2008 | Monti et al. | |
| 2012/0306408 A1 | 12/2012 | Chung et al. | |

OTHER PUBLICATIONS

U.S. Non-Final Office Action; U.S. Appl. No. 14/528,474 (dated May 22, 2018).

* cited by examiner

*Primary Examiner* — J. E. Schoenholtz
(74) *Attorney, Agent, or Firm* — Vivacqua Law (57) ABSTRACT

A programmable alternating current (AC) load in communication with an equipment under test (EUT) is disclosed, where the EUT generates an equipment under test voltage. The programmable AC load includes an active load profiler (ALP) for creating current modulation load profiles that are sent to the EUT. The ALP includes a voltage source inverter, a control module in operative communication with the voltage source inverter of the ALP, and a grid-connected inverter having an AC side and a direct current (DC) side. The AC side of the voltage source inverter is in communication with the EUT for receiving the equipment under test voltage. The control module sends a control duty signal to the voltage source inverter indicating a switching frequency and a duty cycle of the current modulation load profiles.

20 Claims, 7 Drawing Sheets

PROGRAMMABLE ALTERNATING CURRENT (AC) LOAD HAVING REGENERATIVE AND DISSIPATIVE MODES

RELATED APPLICATIONS

This application is a continuation of U.S. application Ser. No. 14/528,474 filed on Oct. 30, 2014. The entirety of this priority application is hereby incorporated by reference.

FIELD

The disclosed system relates to a programmable alternating current (AC) load and, more particularly, to a programmable AC load for producing a wide variety of load profiles that operates in either a regenerative or dissipative mode.

BACKGROUND

Aircraft electrical systems usually include electrical components, devices, and equipment that require certain power quality characteristics. Thus, the aviation industry requires a programmable alternating current (AC) load that creates a variety of load profile functions. The programmable AC load may include combinations of passive components such as dissipative resistors, inductors, capacitors or motors. By changing or re-arranging the combination of these components, a limited number of load profiles may be generated. Some types of programmable AC loads also include semiconductors such as diodes and insulated-gate bipolar transistors (IGBTs).

Several drawbacks exist with the programmable AC loads currently available. For example, some programmable AC loads may only be capable of producing a limited number of load profiles. In particular, passive components and relatively slow power semiconductors may not be suitable for achieving some types of load profiles such as steady-state fundamental component profiles, harmonic load profiles, transient load profiles, modulation load profiles, and combinations thereof. In particular, diode bridge rectifiers may be used to generate harmonic load profiles. However, the harmonic patterns that are generated using the diode bridge rectifiers are very limited. Also, the passive components within the programmable AC load need to be adjusted in order to vary the magnitude and phase of the harmonic. Moreover, motor loads are typically used to achieve low frequency current modulation profiles. In this case, the modulation pattern is limited in terms of programmable current modulation magnitude and frequency as well as combining the modulation load profile with other types of load profiles, such as transient load profiles or harmonic load profiles.

In addition to the above-mentioned issues, many programmable AC loads currently available are purely dissipative. In other words, the energy processed by the programmable AC load to test a power source may be dissipated by heat, which is not cost-effective and unnecessarily wastes electrical energy. This issue may be further compounded if the programmable AC load is used in a test having a relatively long duration. Thus, there exists a need in the art for a more efficient, cost-effective programmable AC load that generates a wider variety of load profiles.

SUMMARY

In one aspect, a programmable alternating current (AC) load in communication with an equipment under test (EUT) is disclosed. The EUT generates an equipment under test voltage. The programmable AC load includes an active load profiler (ALP) creating current modulation load profiles sent to the EUT and an operational mode selector. The ALP includes a voltage source inverter, a control module in operative communication with the voltage source inverter of the ALP, and a grid-connected inverter having an AC side and a DC side. The AC side of the voltage source inverter is in communication with the EUT for receiving the equipment under test voltage. The control module sends a control duty signal to the voltage source inverter indicating a switching frequency and a duty cycle of the current modulation load profiles. The DC side of the grid-connected inverter is in communication with the DC side of the voltage source inverter of the ALP. The grid-connected inverter provides a regulated DC voltage source to the voltage source inverter of the ALP. The operational mode selector is in communication with the AC side of the grid-connected inverter. The operational mode selector places the programmable AC load in either a regenerative mode where the equipment under test voltage is sent to a main grid or a dissipative mode where the equipment under test voltage is dissipated by heat.

In another aspect, a method of creating current modulation load profiles by a programmable AC load that is sent to an EUT is disclosed. The EUT generates an equipment under test voltage. The method includes sending, by a control module, a control duty cycle to a voltage source inverter. The control duty cycle indicates a switching frequency and a duty cycle of the current modulation load profiles. The method also includes creating the current modulation load profiles sent to the EUT by an ALP. The ALP includes the voltage source inverter. The method further includes providing a regulated DC voltage source to the voltage source inverter of the ALP by a grid-connected inverter. Finally, the method includes placing the programmable AC load in either a regenerative mode where the equipment under test voltage is sent to a main grid or a dissipative mode where the equipment under test voltage is dissipated by heat by an operational mode selector in communication with the grid-connected inverter.

Other objects and advantages of the disclosed method and system will be apparent from the following description, the accompanying drawings and the appended claims.

BRIEF DESCRIPTION OF THE DRAWINGS

FIGS. 2A-2C are exemplary illustrations of inverters that may be used for the ALP and the grid-connected inverter shown in FIG. 1, where

DETAILED DESCRIPTION

Figure 1:
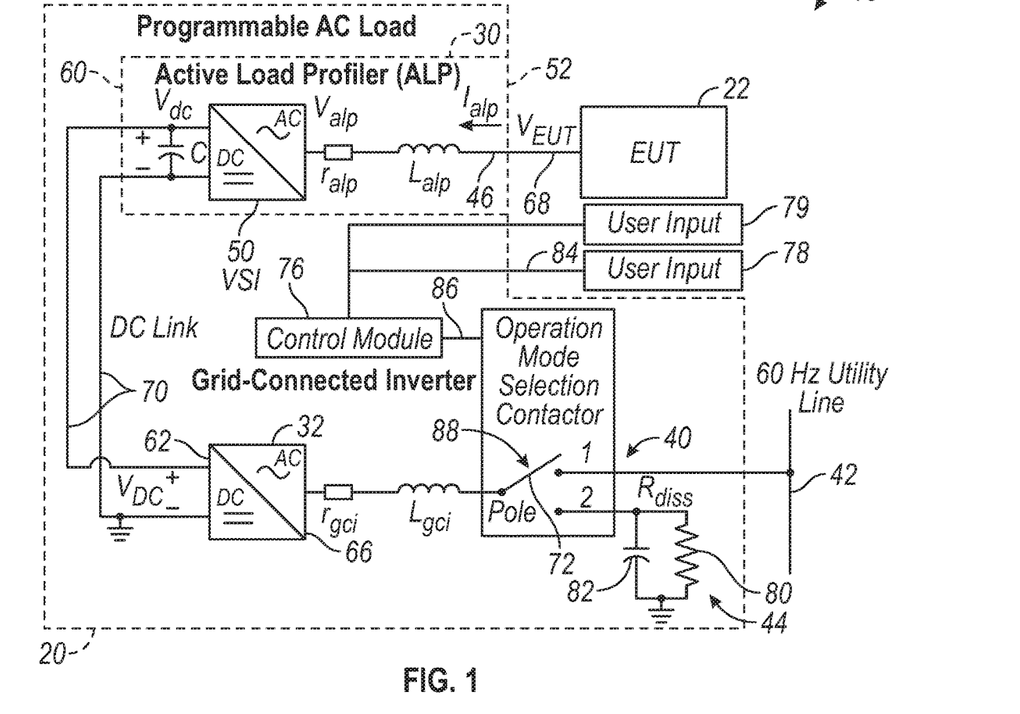
FIG. 1 is a schematic diagram of the disclosed testing system including a programmable alternating current (AC) load in communication with equipment under test (EUT), the programmable load including an active load profiler (ALP) and a grid-connected inverter.

As shown in FIG. 1, FIG. 1 is a schematic view of an exemplary testing system 10 including a programmable alternating current (AC) load 20 in communication with equipment under test (EUT) 22. As used herein, the term AC load refers to an electrical circuit that draws current from another circuit where the drawn current by the AC load is at least one of continuously variable, periodically variable, non-repeating transient, or temporarily steady-state. Similarly, the term direct current (DC) load refers to an electrical circuit that draws current from another circuit where the drawn current by the DC load is nearly constant and non-variable. A DC load could have some moderate drift or change in bias over time, but is generally characterized in that it does not change. In this manner, the AC load described herein is generally characterized in that it is variable, but it can have at least some DC, non-variable attributes in a narrow time sample.

The EUT 22 may be any type of electrical machine that generates AC power such as, for example, a synchronous generator operating at 400 Hertz. The EUT 22 may be subject to testing by the programmable AC load 20. As seen in FIG. 1, the programmable AC load 20 may include an active load profiler (ALP) 30, a grid-connected inverter 32, and an operational mode selector 40. The operational mode selector 40 may be used to connect the programmable AC load 20 to either a main grid or utility line 42 during a regenerative mode, or to one or more dissipative elements 44 in a dissipative mode. In the non-limiting embodiment as shown in FIG. 1, the utility line 42 may include a utility or mains frequency of about 60 Hertz, however those skilled in the art will appreciate that this illustration is merely exemplary in nature. For example, in alternative embodiment, the mains frequency may be about 50 Hertz.

As explained in greater detail below, the ALP 30 of the programmable AC load 20 may be used to provide a variety of load profile functions to the EUT 22. In particular, the ALP 30 may emulate actual conditions that the EUT 22 typically experiences while operating an aircraft. For example, the programmable AC load 20 may generate steady-state load profiles, lower harmonic load profiles (the exact harmonic orders depend on the specific topology of the system), transient load profiles, modulation load profiles, higher order harmonic load profiles, and current modulation load profiles.

The ALP 30 may include an inductor $L_{alp}$, a voltage source inverter (VSI) 50, and a capacitor C (the resistance $r_{alp}$) illustrated in FIG. 1 represents parasitic resistance of the inductor $L_{alp}$). An AC side 52 of the VSI 50 is in operative communication with the EUT 22, where the inductor $L_{alp}$ is located between the VSI 50 and the EUT 22. Specifically, the EUT 22 may generate an equipment under test voltage $V_{EUT}$. The equipment under test voltage $V_{EUT}$ may be sent to the VSI 50 via a current line 46. The ALP 30 may also include a DC side 60. The DC side 60 of the VSI 50 is connected to a DC side 62 of the grid-connected inverter 32. The grid-connected inverter 32 provides a regulated DC voltage source $V_{DC}$ to the VSI 50. The ALP 30 may create one or more load profile functions that is ultimately provided to the EUT 22 based on the regulated DC voltage source $V_{DC}$ from the grid-connected inverter 32.

Figure 2A:
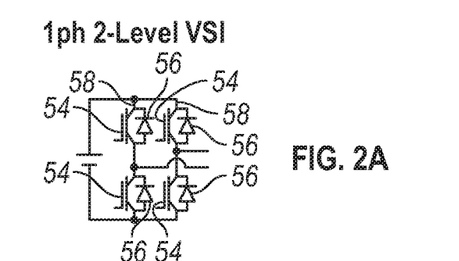
FIG. 2A is a single phase, 2-level inverter.
Figure 2B:
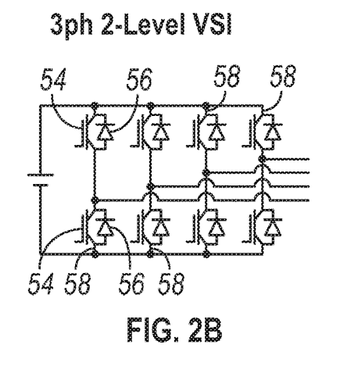
FIG. 2B is a three-phase 2-level inverter.
Figure 2C:
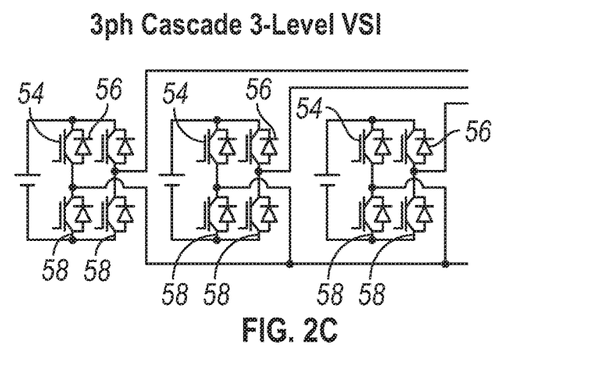
FIG. 2C is a three-phase cascade 3-level inverter.

The VSI 50 as well as the grid-connected inverter 32 may be any type of inverter for converting DC voltage sources into AC voltage sources in a controlled manner. For example, referring to FIGS. 2A-2C, the VSI 50 or the grid-connected inverter 32 may be a single phase, 2-level inverter as seen in FIG. 2A, a three-phase 2-level inverter as seen in FIG. 2B, or a three-phase cascade 3-level inverter as seen in FIG. 2C. As seen in each of FIGS. 2A-2C, the exemplary inverters may include a switching leg structure, where a plurality of power transistors 54 in combination with antiparallel diodes 56 are located on each leg 58 of the inverter. The power transistors 54 may be, for example, insulated-gate bipolar transistors (IGBTs) or metal-oxide-semiconductor field-effect transistors (MOSFETs). In the embodiment as seen in FIG. 2B, the inverter is a three-phase inverter having a neutral leg configuration. FIG. 2C is an illustration of a multilevel inverter that is capable of producing more than two voltage levels.

Figure 4A:
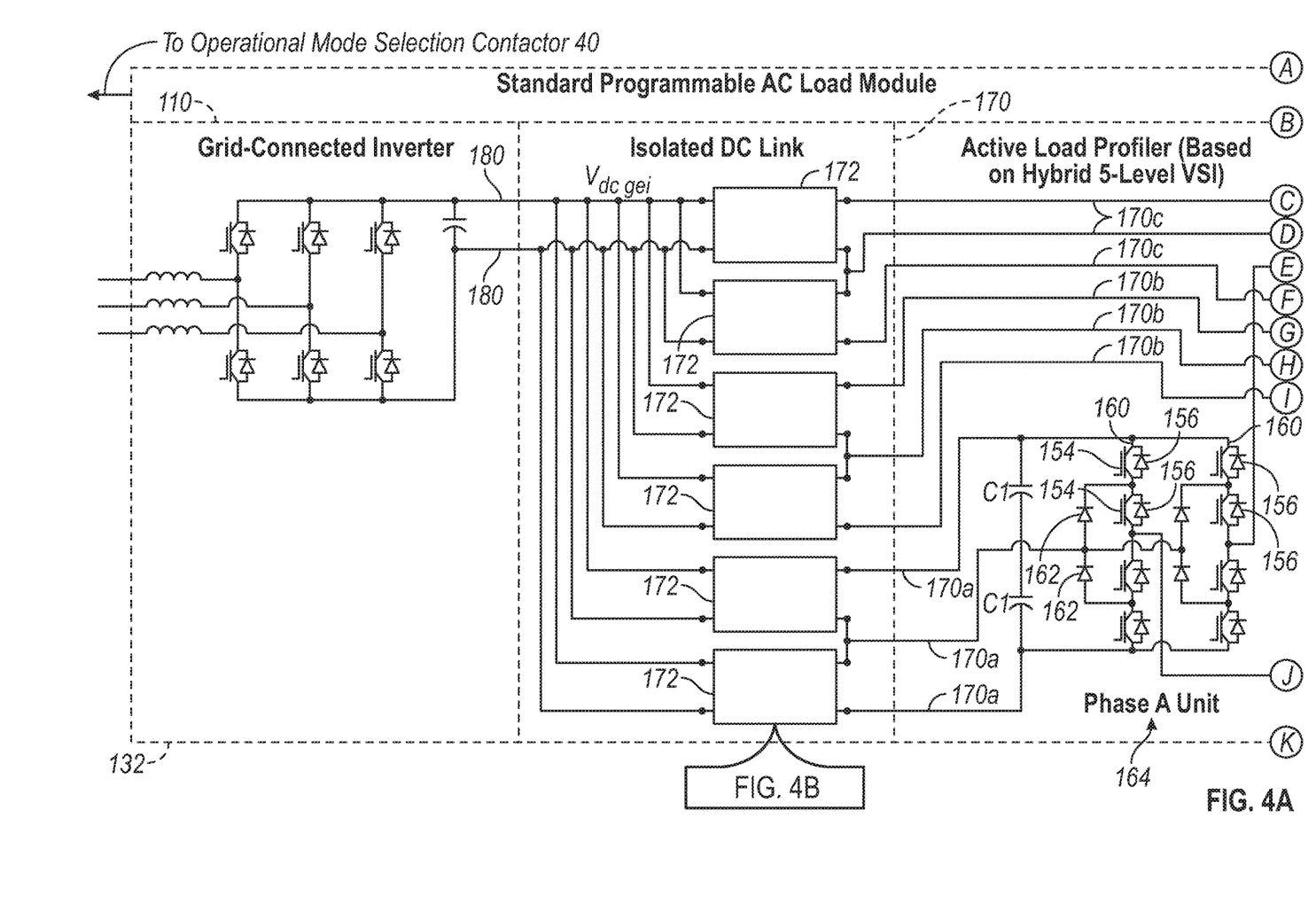
FIG. 4A is a schematic diagram of a programmable AC load based on hybrid 5-level voltage source inverter topology.

Those skilled in the art will readily appreciate that the illustrations shown in FIGS. 2A-2C are merely exemplary in nature, and that the VSI 50 and the grid-connected inverter 32 shown in FIG. 1 may include a variety of configurations. In particular, it is to be understood that the topology of the VSI 50 determines the topology of the remaining electrical components within the testing system 10. For example, in the embodiment as shown in FIG. 1, if the VSI 50 is a 2-level inverter, then the grid-connected inverter 32 may also be a 2-level inverter as well. Moreover, a DC link 70 including a positive rail and a negative rail may be used to connect the DC side 60 of the 2-level ALP 30 to the DC side 62 of the 2-level grid-connected inverter 32. Thus, the topology of the VSI 50 determines the topology of both the grid-connected inverter 32 and the DC link 70. Those skilled in the art will also readily appreciate that if the VSI 50 is a multilevel inverter (i.e., more than two voltage levels), then a multilevel DC link (not illustrated in FIG. 1) may be used to connect the ALP 30 to multiple DC voltage sources (not illustrated). FIG. 4A is an illustration of the VSI 50 as a multilevel inverter connected to multiple isolated DC-DC converters, and is described in greater detail below.

Continuing to refer to FIG. 1, an AC side 66 of the grid-connected inverter 32 may be connected to the operational mode selector 40 through a line filtering inductor $L_{gci}$, where $r_{gci}$ represents the parasitic resistance of the inductor $L_{gci}$. A control module 76 is in operational communication with the operational mode selector 40, a first user input 78, and a second user input 79. The first user input 78 and the second user input 79 may be any type of device configured to receive user-generated input from an individual and send a control signal to the control module 76 indicative of the input generated by the individual. For example, in one embodiment, the first and second user inputs 78, 79 may be a keypad or touchscreen.

The individual may determine whether the testing system 10 should operate in the regenerative mode or the dissipative mode based on various parameters of the testing system 10. For example, the individual may check to see if the testing system 10 is properly connected to the utility line 42 first before selecting the regenerative mode. In the event the testing system 10 is not connected to the utility line 42 or if there is no utility line 42 currently available, then the individual may select dissipative mode. Once the individual makes the determination, he or she may manipulate the first user input 78 accordingly.

Once a selection is made by the individual, the user input 78 sends a control signal 84 indicative of the input from the individual to the control module 76. The control module 76 may then send a second control signal 86 to the operational mode selector 40 to connect a switch 88 to either terminal 1 (which places the testing system 10 in regenerative mode) or terminal 2 (which places the testing system 10 in dissipative mode). The control module 76 may refer to, or be part of, an application specific integrated circuit (ASIC), an electronic circuit, a combinational logic circuit, a field programmable gate array (FPGA), a processor (shared, dedicated, or group) that executes code, or a combination of some or all of the above, such as in a system-on-chip.

In the non-limiting embodiment as shown, the switch 88 is a single-pole double-throw switch, however it is to be understood that other types of switching elements may be used as well such as, for example, a transistor. As seen in FIG. 1, when a pole 72 of the switch 88 is connected to terminal 1, then the grid-connected inverter 32 is connected to the utility line 42, and the testing system 10 is operating in the regenerative mode. During regenerative mode, energy drawn from the EUT 22 may be processed through the ALP 30 (i.e., the VSI 50 converts the AC power to DC power), and is sent through the DC link 70 to the grid-connected inverter 32. The grid-connected inverter 32 converts the DC power from the VSI 50 back into AC power, and then sends the AC to the switch 88, and back to the utility line 42. In other words, during regenerative mode, the power from the EUT 22 is sent back to the utility line 42 instead of dissipating the power from the EUT 22 as heat. Those skilled in the art will readily appreciate that the regenerative mode results in a more efficient, cost-effective testing system 10. Moreover, the regenerative mode may also be advantageous in situations where the testing system 10 is located within an environment having limited heat dissipation capabilities.

When the pole 72 of the operational mode selector 40 is connected to terminal 2, then the grid-connected inverter 32 is connected to the dissipative elements 44. In the non-limiting embodiment as shown in FIG. 1, the dissipative elements 44 may include a resistor 80 connected in parallel with a capacitor 82, however those skilled in the art will readily appreciate that any number of elements for dissipating electrical energy into heat may be used as well. During dissipative mode, the grid-connected inverter 32 may act as an energy dissipation converter, where the power from the EUT 22 is transferred through the DC link 70, and is dissipated by the dissipative elements 44. In both regenerative and dissipative modes, the grid-connected inverter 32 may be used to regulate the regulated DC voltage source $V_{DC}$, since stable DC voltage is needed by the VSI 50 in order to create specific load profiles.

Continuing to refer to FIG. 1, at a given frequency $\omega$, a desired load current control reference $I_{alp\_ref}(t) \angle \theta_{Ialp\_ref}(t)$ may be determined based on a user-specified or desired load impedance $Z(t) \angle \theta_Z(t)$ and a measured terminal voltage $V_{EUT}(t) \angle \theta_{VEUT}(t)$ across output terminals 68 of the EUT 22 according to Equation 1. Specifically, an individual may enter a specific value of the desired load impedance $Z(t) \angle \theta_Z(t)$ by manipulating the second user input 79. Equation 1 is expressed as:

$$I_{alp_{ref}}(t) \angle \theta_{Ialp_{ref}}(t) = \frac{V_{EUT}(t) \angle \theta_{VEUT}(t)}{Z(t) \angle \theta_Z(t)} \qquad \text{Equation 1}$$

Equation 2 determines an actual load current $I_{alp}(t) \angle \theta_{Ialp}(t)$ (the actual load current represents line current through the inductor $L_{alp}$).

$$I_{alp}(t) \angle \theta_{Ialp}(t) = \frac{V_{alp}(t) \angle \theta_{alp}(t) - V_{EUT}(t) \angle \theta_{VEUT}(t)}{r_{alp} + j\omega L_{alp}} \qquad \text{Equation 2}$$

where $V_{alp}$ is the voltage input into the VSI 50, $I_{alp}$ is the current input into the VSI 50, and j is an imaginary component.

Figure 3:
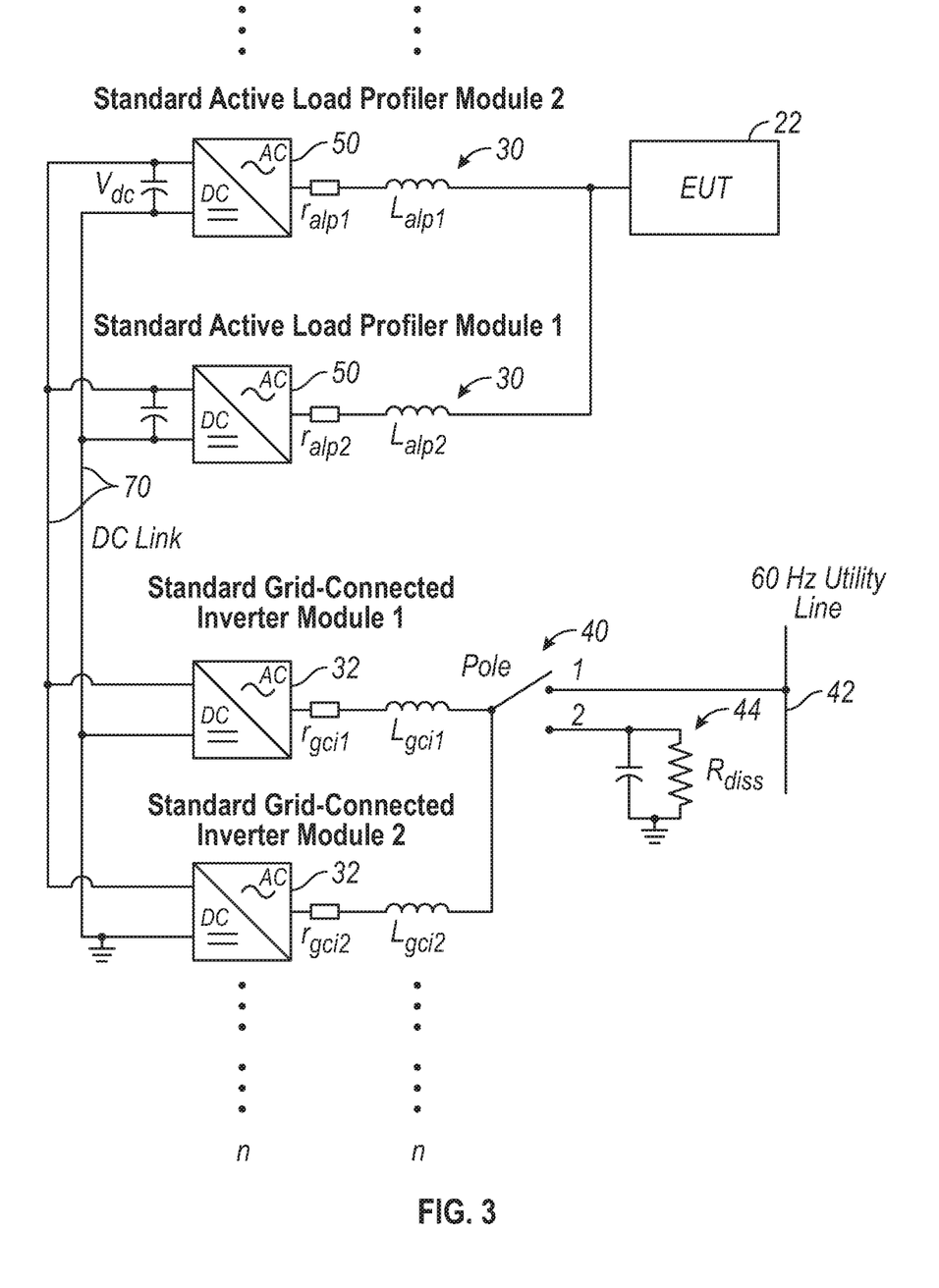
FIG. 3 is a schematic diagram of an alternative embodiment of the programmable AC load, where a parallel interleaving topology includes two or more substantially identical ALPs connected in parallel with the EUT shown in FIG. 1.

Those skilled in the art will readily appreciate that the semiconductors (i.e., the power transistors 54 seen in FIGS. 2A-2C) used in the grid-connected inverter 32 and the VSI 50 may possess a limited maximum current. Therefore, turning to FIG. 3, a parallel interleaving topology may be implemented where two or more ALPs 30 that may be substantially identical to one another may be connected in parallel with the EUT 22 through respective inductors $L_{alp1}$, $L_{alp2}$, etc. As seen in FIG. 3, the DC link 70 may be used to connect multiple ALPs 30 to multiple grid-connected inverters 32. It is to be understood that the multiple grid-connected inverters 32 may also be substantially identical to one another, and are also connected in parallel to one another. The substantially identical ALPs 30 and grid-connected inverters 32 enable the testing system 10 to have a higher rated current, since each grid-connected inverter 32 and VSI 50 is limited in power or current individually. Those skilled in the art will also appreciate current sharing control should be used to control the ALPs 30 and grid-connected inverters 32. This is because the ALPs 30 and grid-connected inverters 32 have circuit mismatch, which may lead to unbalanced current sharing if no current sharing mechanism is employed.

FIG. 4A is a detailed schematic diagram of an exemplary programmable AC load 120. The programmable AC load 120 is capable of generating steady-state load profiles, lower harmonic load profiles (the exact harmonic orders depend on the specific topology of the system), transient load profiles, and modulation load profiles. As seen in FIG. 4A, the programmable AC load 120 includes an active ALP 130 that is based on a hybrid 5-level VSI 150, an isolated DC link 170, and a grid-connected inverter 132.

The ALP 130 may be based on a hybrid 5-level voltage source inverter topology, however as seen in FIG. 4A, the grid-connected inverter 132 may still employ 2-level voltage source inverter topology. The grid-connected inverter 132 is connected to the operational mode selector 40 (shown in FIG. 1). In the embodiment as shown, an EUT 122 outputs three-phase voltage as $V_a$, $V_b$, and $V_c$ over four voltage lines A, B, C, and N. The ALP 130 is a three-phase hybrid 5-level voltage source inverter including three-phase units 164, which are phase unit A, phase unit B, and phase unit C. Specifically, phase unit A, phase unit B, and phase unit C each include two three-phase legs 160. As seen in FIG. 4A, each phase leg 160 includes a plurality of power transistors 154 in combination with antiparallel diodes 156, as well as two clamping diodes 162. In the exemplary embodiment as shown, the power transistors 154 are IGBTs. In an embodiment, the VSI 150 may be controlled using sinusoidal pulse width modulation (SPWM) in order to produce five different voltage levels. It is to be understood that while FIG. 4A illustrates a three-phase load, the programmable AC load 120 is also capable of operating as a single phase load as well.

Each three-phase unit 164 (i.e., phase unit A, phase unit B, and phase unit C) may be connected to three corresponding DC rails 170a, 170b, and 170c through corresponding capacitors C1. Specifically, phase unit A is connected to three DC rails 170a, phase unit B is connected to three DC rails 170b, and phase unit C is connected to three DC rails 170c. Each of the DC rails 170a, 170b, 170c are connected to at least one bidirectional DC-DC converter 172. Specifically, as seen in FIG. 4A, each three-phase unit 164 of the VSI 150 is connected to two of the six bidirectional DC-DC converters 172 through a corresponding set of DC rails 170a, 170b, 170c. The six bidirectional DC-DC converters 172 comprise or make up the isolated DC link 170 that connects the grid-connected inverter 132 with the ALP 130. The six bidirectional DC-DC converters 172 may be substantially identical to one another. Each bidirectional DC-DC converter 172 may include the circuitry as seen in FIG. 4B.

Figure 4B:
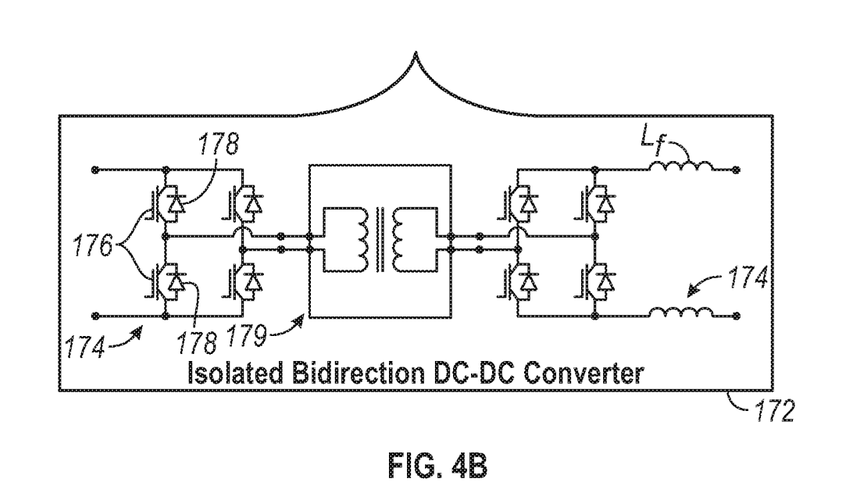
FIG. 4B is a schematic diagram of one of the bi-directional DC-DC converters shown in FIG. 4A.

Referring to FIG. 4B, in one exemplary embodiment each bidirectional DC-DC converter 172 may include two full-bridge switching cells 174, a high-frequency transformer 179, and a filter inductor $L_f$. Each full-bridge switching cell 174 includes a plurality of power transistors 176 (e.g., IGBTs) in combination with antiparallel diodes 178. Referring to both FIGS. 4A and 4B, the grid-connected inverter 132 generates a regulated DC voltage $V_{dc\_gci}$ that is sent to the bidirectional DC-DC converters 172 over a DC link 180. The bidirectional DC-DC converters 172 each regulate the DC voltage $V_{dc\_gci}$ from the grid-connected inverter 132 at the same levels, and supply regulated DC voltage to each of the three-phase units 164 of the ALP 130. As seen in FIG. 4A, the DC link 180 includes only 2 DC rails since the grid-connected inverter 132 employs 2-level voltage source inverter topology.

Turning back to FIG. 1, it is to be understood that the VSI 50 and the grid-connected inverter 32 may comprise of semiconductors (i.e., the power transistors 54 shown in FIGS. 2A-2C) that are generally capable of handling relatively high currents. For example, in one embodiment, the semiconductors are capable of handling current between about 100 to about 200 Amps. However, these semiconductors may not be able to switch fast enough to produce higher order harmonic load profiles. In the embodiments as described, higher order harmonic load profiles may be any harmonic that is above fundamental frequency, but is still within system stability concerns. For example, in one embodiment a higher order harmonic may be any harmonic from second order to fortieth order. However, those skilled in the art will readily appreciate that this harmonic range is merely exemplary and a wider range or a narrower range of harmonic orders may be used as well. Moreover, the exact range of harmonic orders depend on the specific topology of the system.

Figure 5:
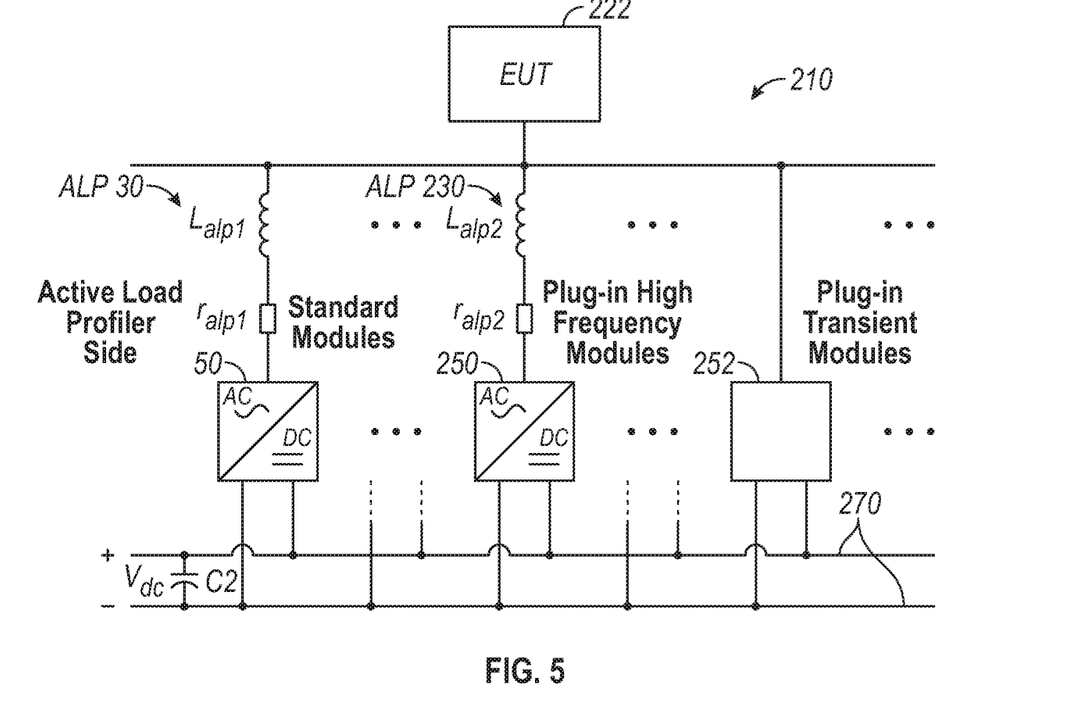
FIG. 5 is a schematic diagram of an alternative embodiment of the programmable AC load, where the ALP includes one or more plug-in high frequency modules.

Turning to FIG. 5, an alternative embodiment of a testing system 210 capable of generating higher order harmonics is illustrated. Specifically, the testing system 210 may include the ALP 30. The ALP 30 includes a standard VSI 50. In addition to the standard VSI 50, the testing system 210 also includes one or more ALPs 230 that include a plug-in high frequency module 250. The standard VSI 50 includes the same type of semiconductors as the VSI 50 shown in FIG. 1. In contrast, the plug-in high frequency module 250 is an inverter including smaller, faster semiconductor devices capable of generating higher order harmonics. In particular, the semiconductors located within the plug-in high frequency module 250 include higher switching times (i.e., with a turn-on and turn-off time of less than about 80 ns), thereby resulting in tracking higher order harmonic current.

For example, in one embodiment, the plug-in high frequency module 250 may include IGBTs and MOSFETs having electronic component packaging that conforms to one of the following transistor outlines: To-220, To-247, To-252, or To-263, which are commonly used standard size semiconductors. These transistor outlines may enable the plug-in high frequency module 250 to generate higher order harmonic load profiles, such as second order to fortieth order harmonics. As seen in FIG. 5, the plug-in high frequency module 250 may be connected in parallel with the standard VSI 50, and is also connected to an EUT 222 through an inductor $L_{alp2}$. The plug-in high frequency module 250 may also be connected to one or more grid-connected inverters 32 (shown in FIG. 1) though the DC rail 270.

The testing system 210 may also include one or more plug-in transient modules 252. The plug-in transient module 252 may also be connected in parallel with the standard ALP 30 and the plug-in high frequency module 250. The plug-in transient module 252 may be an inverter that is used to generate non-repeating, transient current profiles. Some examples of transient current profiles include, but are not limited to, in-rush current transient profiles and short circuit transient profiles. Specifically, the plug-in transient module 252 may emulate a transient condition that occurs during operation of an aircraft. As seen in FIG. 5, the plug-in transient module 252 may not be connected to the DC rails 270.

Figure 6:
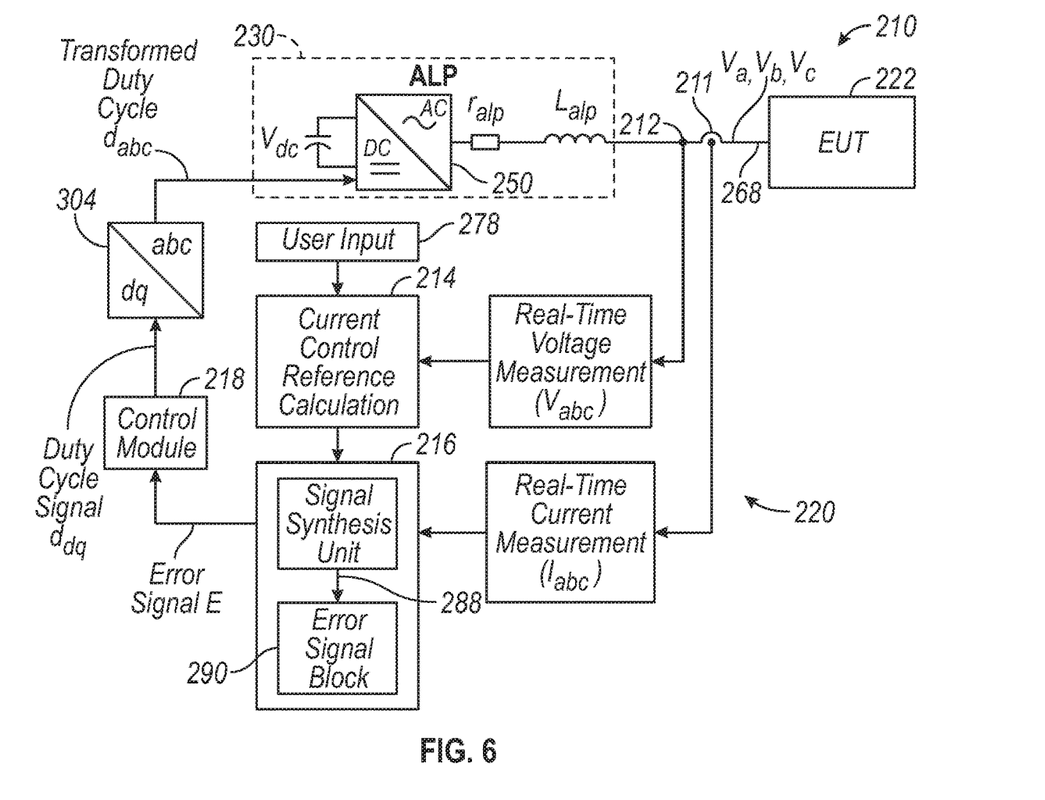
FIG. 6 is a schematic diagram of a control structure for one of the plug-in high frequency modules shown in FIG. 5, where the control system includes a signal synthesis unit and a control module.

FIG. 6 is an illustration of a control structure of the ALP 230 for achieving higher order harmonics. As seen in FIG. 6, a current sensor 211 and a voltage sensor 212 may be placed across output terminals 268 of the EUT 222. The current sensor 211 senses a real or actual harmonic line current $I_n \angle \beta$ at the output terminals 268 of the EUT 222. The actual harmonic line current $I_n \angle \beta$ is composed of fundamental frequency components as well as harmonic frequency components. Likewise, the voltage sensor 212 senses a real or actual harmonic line voltage $V_n \angle \alpha$. The actual harmonic line voltage $V_n \angle \alpha$ is also composed of fundamental frequency components as well as harmonic components. The actual harmonic line current and the actual harmonic line voltage are at $n^{th}$ order harmonics, where n=1 at fundamental frequency. Harmonic impedance may be expressed in Equation 3 as:

$$Z_n \angle (\alpha - \beta), \quad \text{Equation 3}$$

where $$Z_n = \frac{V_n}{I_n}$$

A user input 278 may receive a reference harmonic current $I_{nr} \angle \beta_r$ determined by an individual. Specifically, an individual may determine a value of the reference harmonic current $I_{nr} \angle \beta_r$, and inputs this desired value into the user input 278. Alternatively, in another embodiment, a user may determine a value of a harmonic impedance control reference $Z_{nr} \angle \gamma_r$ instead, and inputs this desired value into the user input 278. A current control reference calculation block 214 determines the reference harmonic current $I_{nr}\angle\beta_r$ based on the actual harmonic line voltage $V_n\angle\alpha$ using Equation 4:

$$I_{nr}\angle\beta_r = \frac{V_n\angle\alpha}{Z_{nr}\angle\gamma_r} \qquad \text{Equation 4}$$

The EUT 222 outputs three-phase voltage as $V_a$, $V_b$, and $V_c$. The current sensor 211 may produce a real-time current measurement $I_{abc}$, which is representative of the current at the output terminals 268 of the EUT 222. Likewise, the voltage sensor 212 produces a real-time voltage measurement $V_{abc}$, which is representative of the voltage at the output terminals 268 of the EUT 222. As explained in greater detail below, the control structure of the programmable AC load 220 may be used to ensure that the actual harmonic current $I_n\angle\beta$ tracks or follows the reference harmonic current $I_{nr}\angle\beta_r$, and does not substantially impact the fundamental current control of the ALP 230.

Figure 7:
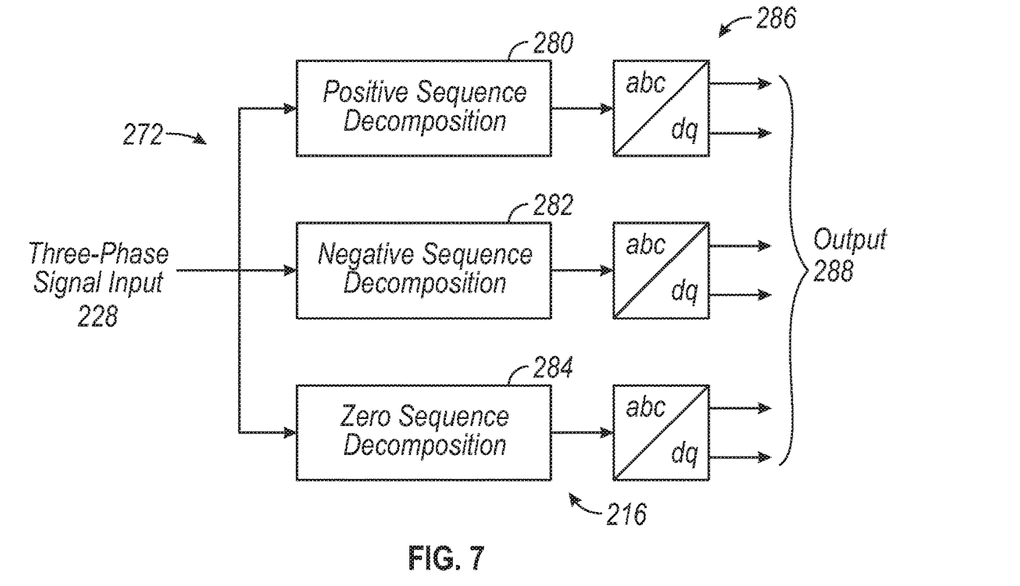
FIG. 7 is a block diagram of the signal synthesis unit shown in FIG. 6.

Continuing to refer to FIG. 6, a signal synthesis block 216 may receive the reference harmonic current $I_{nr}\angle\beta_r$. The signal synthesis block 216 also receives as input the real-time current measurement $I_{abc}$ from the current sensor 211 as well as the real-time voltage measurement $V_{abc}$ from the voltage sensor 212. FIG. 7 is a detailed block diagram of the signal synthesis block 216. Referring to both FIGS. 6 and 7, a three-phase signal input 228 indicative of the real-time current measurement $I_{abc}$ and the real-time voltage measurement $V_{abc}$ measured across the output terminals 268 of the EUT 222 is inputted into the signal synthesis block 216.

The signal synthesis block 216 may transfer the three-phase signal input 228 into a set of three symmetrical sequences by a sequence decomposer 276. Specifically, the sequence decomposer 276 includes a positive sequence decomposition block 280, a negative sequence decomposition block 282, and a zero sequence decomposition block 284. As explained below, the sequence decomposer 276 transfers the three-phase signal input 228 into a positive sequence component, a negative sequence component, and a zero sequence component. For example, three voltage phasors $V_A$, $V_B$ and $V_C$ have a positive sequence ABC. Using symmetrical sequence components it is possible to represent each phasor voltage as positive sequence component (i.e., $V_A^+$, $V_B^+$, $V_C^+$), a negative sequence component (i.e., $V_A^-$, $V_B^-$, $V_C^-$), and a zero sequence component (i.e., $V_A^0$, $V_B^0$, $V_C^0$).

The positive sequence component rotates in the same direction as a symmetrical ABC sequence. The negative sequence component rotates in an opposite direction of the ABC sequence, and the zero sequence component is non-rotational. Sequence decomposition may be used for fundamental frequencies as well as non-fundamental components (i.e., harmonic components). The harmonic component of the three-phase signal input 228 is eventually transferred into an AC signal with a dedicated frequency in a synchronous rotating domain (dq) time domain, which is also explained in detail below.

The signal synthesis block 216 also includes an abc-to-dq transformer 286. Signals generated by the sequence decomposer 276 may be provided as input to the abc-to-dq transformer 286. The abc-to-dq transformer 286 may transform signals from the sequence decomposer 276 into signals that may be manipulated in the dq coordinate system. Specifically, the abc-to-dq transformer 286 performs three-phase signal to synchronous rotating frame transformation, where the fundamental three-phase signal input 228 is represented by two DC quantities, d and q, in the rotating frame, and the harmonic components are represented by the AC signal with a dedicated frequency in the dq time domain (positive, negative, or zero sequence). Thus, for each sequence component (i.e., the positive sequence component, a negative sequence component, and a zero sequence component), a generalized form for three-phase signals in the dq frame may be expressed by Equation 5. Specifically, an output 288 of the signal synthesis block 216 may be expressed in Equation 5 as:

$$C + M_{g1}\cos(\omega_1 t + \varphi_1) + M_{g2}\cos(\omega_2 t + \varphi_2) + M_{g3}\cos(\omega_3 t + \varphi_3) \qquad \text{Equation 5}$$

where C is a dc constant that represents a fundamental component, and the terms $M_{g1}\cos(\omega_1 t + \varphi_1)$, $M_{g2}\cos(\omega_2 t + \varphi_2)$, etc. represent harmonic components.

Referring to both FIGS. 6 and 7, a control module 218 may be in operative communication to receive an error signal E from the signal synthesis block 216. The signal synthesis block 216 may include an error signal block 290 for determining the error signal E. As explained in greater detail below, the error signal E may be based on the difference between the reference harmonic current $I_{nr}\angle\beta_r$ and the output 288 determined by the signal synthesis block 216.

Figure 8:
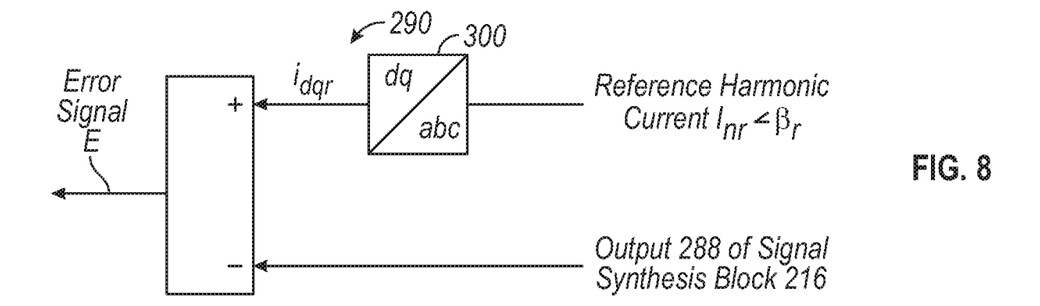
FIG. 8 is a block diagram of an error block shown in FIG. 6 that is part of the signal synthesis block.

FIG. 8 is an exemplary illustration of the error signal block 290. The error signal block 290 may include a abc-to-dq transformer 300 that receives the reference harmonic current $I_{nr}\angle\beta_r$ from the current control reference calculation block 214 (shown in FIG. 6). The abc-to-dq transformer 300 may transform the reference harmonic current $I_{nr}\angle\beta_r$ into signals that may be manipulated in the dq coordinate system. In particular, the abc-to-dq transformer 300 determines a control reference current value $i_{dqr}$ that is expressed in the dq coordinate system. The control reference current value $i_{dqr}$ may be sent to an error calculation block 302. The output 288 determined by the signal synthesis block 276, which is already expressed in the dq frame, may also be sent the error calculation block 302. The error calculation block 302 may subtract the control reference current value $i_{dqr}$ from the output 288 in order to obtain the error signal E.

Turning back to FIG. 6, the control module 218 may be in operative communication with a single plug-in high frequency module 250. The control module 218 outputs a control duty cycle signal $d_{dq}$ based on the error signal E. The duty cycle signal $d_{dq}$ is first transformed from the dq coordinate system back to the abc coordinate system by a dq-to-abc transformer block 304. The transformed duty cycle signal $d_{abc}$ may then be sent to the plug-in high frequency module 250. The transformed duty cycle signal $d_{abc}$ indicates the switching frequency for the semiconductors contained within the corresponding plug-in high frequency module 250.

The control module 218 may be based on classic dq decoupling control structure. Classic dq decoupling control structure occurs when three-phase fundamental AC signals are transformed into the synchronous rotating domain dq for DC quantities. The control module 218 may be designed to handle multiple dq quantities at different sequences. In other words, the positive sequence component, the negative sequence component, and the zero sequence component generated by sequence decomposer 276 (FIG. 7) may each generate dq components. A transfer function P(s) of the plant (i.e., the programmable AC load 220) may be expressed in Equation 6 as:

$$P(s) = \frac{i_{dq}}{d_{dq}} = \frac{V_{DC}}{Ls + r_L} \quad \text{Equation 6}$$

where $i_{dq}$ is the real-time current measurement, $V_{DC}$ is the regulated DC voltage source from the grid-connected inverter 232 (FIG. 5), $d_{dq}$ is the control duty cycle, L is the inductance from the inductor $L_{alp}$, and $r_L$ is the equivalent serial resistance of the inductor $L_{alp}$.

In order to track the dc constant C of the output of the signal synthesis block 216 expressed in Equation 5, the control module 218 may include design parameters based on Equation 7:

$$C_d = \frac{K}{s} \quad \text{Equation 7}$$

where $C_d$ represents the control module 218, K is gain, and s represents a parameter in the Laplace domain. It is to be understood that the gain K is selected such that the system may track the control reference current value $i_{dqr}$ within a specific tolerance range (i.e., +/−2%).

The tracking of the harmonic components of the output of the signal synthesis block 216 expressed in Equation 5, (i.e., the AC signal components) may now be described. For purposes of simplicity, the output of the signal synthesis block 216 may be expressed using only one sinusoidal term (which corresponds to a dedicated harmonic) with a frequency of w, and is shown in Equation 8 as:

$$C + M_g \cos(\omega t + \varphi) \quad \text{Equation 8}$$

It is to be understood that although Equation 8 only expresses a single frequency ω, the control module 218 performs multiple calculations in parallel with one another in order to determine the various harmonic components included within the output of the signal synthesis block 216 (Equation 5). Equation 9 is an expression of a closed-loop control reference to output transfer function, which is used to track the frequency w expressed in Equation 8 (where the frequency ω is a sinusoidal component). Specifically, Equation 9 may be expressed as:

$$\frac{i_{dq}}{i_{dqr}} = \frac{2\omega_c s}{s^2 + 2\omega_c s + \omega^2} = \frac{M \frac{V_{DC}}{Ls + r_L}}{1 + M \frac{V_{DC}}{Ls + r_L}} \quad \text{Equation 9}$$

where $\omega_c$ is the pass band bandwidth, and M represents the control module 218. Solving for M in Equation 9 yields Equation 10:

$$M = \frac{2\omega_c s \left(\frac{Ls + r_L}{V_{DC}}\right)}{s^2 + \omega^2} \quad \text{Equation 10}$$

The control module 218 has zero dc gain. The control module 218 calculates each of the various harmonic components included within the output of the signal synthesis block 216 in parallel with another, and also calculates the dc component C of the output of the signal synthesis block 216 in parallel as well. However, since there is zero DC gain, tracking the dc component C may not be affected by the calculation of the various harmonic components. In particular, a dc quantity control loop crossover frequency, which represents a parameter of DC quantity control, may be relatively low when compared to the angular frequency w. Thus, those skilled in the art will readily appreciate that the control module 218 may be designed to determine multiple harmonic frequencies, without affecting DC quantity control, which corresponds to the fundamental component control of the ALP 230.

Figure 9:
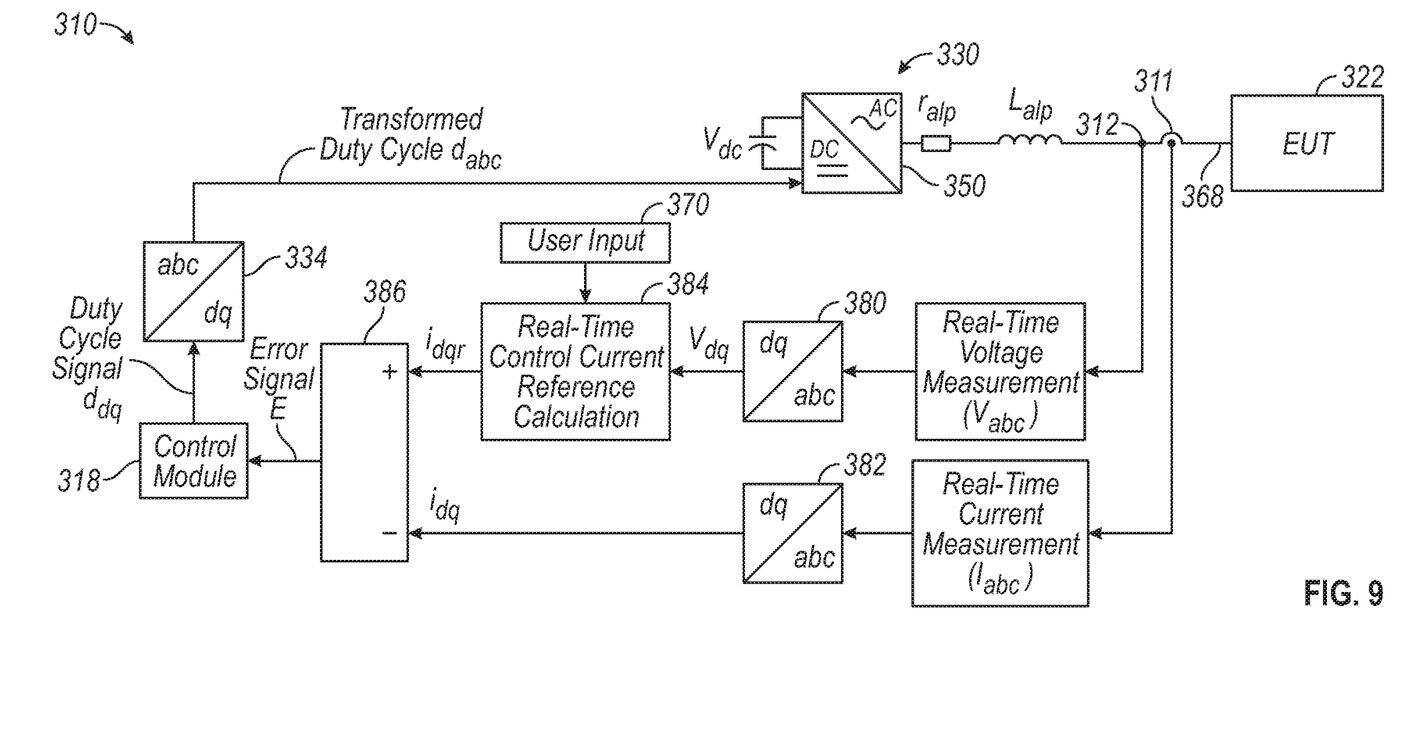
FIG. 9 is a schematic diagram of another embodiment of the ALP shown in FIG. 1, where the ALP includes control structure for current modulation.

FIG. 9 is an alternative embodiment of a testing system 310, where an ALP 330 may provide current modulation load profiles. The ALP 330 may include a VSI 350 that is connected to a grid-connected inverter (shown in FIG. 1). It is to be understood that unlike the VSI 50 shown in FIG. 6, the VSI 350 may not require semiconductors having relatively fast switching times (i.e., IGBTs and MOSFETs having To-220, To-247, To-252, or To-263 transistor outlines).

Continuing to refer to FIG. 9, a current sensor 311 and a voltage sensor 312 may be placed across output terminals 368 of the EUT 222. The current sensor 311 may produce a real-time current measurement $I_{abc}$, which is representative of the current at the output terminals 368 of the EUT 322. Likewise, the voltage sensor 312 produces a real-time voltage measurement $V_{abc}$, which is representative of the current across the output terminals 368 of the EUT 322.

The testing system 310 may also include a user input 370, a voltage abc-to-dq transformer 380, a current abc-to-dq transformer 382, a reference calculation block 384, an error signal block 386, a control module 318, and an abc-to-dq transformer 380. The voltage abc-to-dq transformer 380 may be used to transform the 3-phase real-time voltage measurement $V_{abc}$ detected by the voltage sensor 312 into a real-time voltage signal $V_{dg}$ that may be manipulated in the dq coordinate system. Similarly, the current abc-to-dq transformer 382 may be used to transform the 3-phase real-time current measurement $I_{abc}$ detected by the current sensor 311 into a real-time current signal $i_{dq}$ that may be manipulated in the dq coordinate system.

The reference calculation block 384 receives as input the real-time voltage signal $V_{dg}$ from the voltage abc-to-dq transformer 380 as well as a three-phase balanced current control reference $I_{abcr}$ value received from the user input 370. As explained in detail below, the reference calculation block 384 determines the control reference current value $i_{dqr}$ based on the real-time voltage signal $V_{dq}$ and the three-phase balanced current control reference $I_{abcr}$.

The calculation of the control reference current value $i_{dqr}$ by the reference calculation block 384 may now be explained. The three-phase balanced current control reference $I_{abcr}$ may be expressed in vector form in Equation 11 as:

$$i_{dqr} = \begin{bmatrix} i_{ar} \\ i_{br} \\ i_{cr} \end{bmatrix} = \begin{bmatrix} I_p \cos(\omega t + \theta) \\ I_p \cos\left(\omega t + \theta - \frac{2\pi}{3}\right) \\ I_p \cos\left(\omega t + \theta + \frac{2\pi}{3}\right) \end{bmatrix} \quad \text{Equation 11}$$

where $I_p$ is the magnitude of a three-phase balanced current control reference $I_{abcr}$ and is a constant, θ is phase, and ω is angular frequency (where ω=2πf, and f is frequency). Equation 12 is the abc-to-dq0 transformation matrix that is used to transform abc quantities into dq0 quantities. In Equation 13, the corresponding control reference in dq0 domain is obtained. In particular, Equation 13 expresses that given a three-phase current control reference $I_{abcr}$ that is balanced and fixed, the corresponding d and q quantities are constant, depending on an initial phase θ and magnitude $I_p$.

$$T = \sqrt{\frac{2}{3}} \begin{bmatrix} \cos\omega t & \cos\left(\omega t - \frac{2\pi}{3}\right) & \cos\left(\omega t + \frac{2\pi}{3}\right) \\ -\sin\omega t & -\sin\left(\omega t - \frac{2\pi}{3}\right) & -\sin\left(\omega t + \frac{2\pi}{3}\right) \\ \frac{1}{\sqrt{2}} & \frac{1}{\sqrt{2}} & \frac{1}{\sqrt{2}} \end{bmatrix} \quad \text{Equation 12}$$

$$i_{dq0r} = \begin{bmatrix} i_{dr} \\ i_{dr} \\ i_{0r} \end{bmatrix} = T i_{abcr} = \frac{\sqrt{6}}{2} \begin{bmatrix} I_p\cos\theta \\ I_p\sin\theta \\ 0 \end{bmatrix} \quad \text{Equation 13}$$

Equation 14 expresses current magnitude modulation based on the three-phase balanced current control reference $I_{abcr}$. As seen in Equation 14, the magnitude of the three-phase balanced current control reference $I_{abcr}$ is no longer constant. Instead, a modulation term $i_m \cos(\omega_m t + \theta_m)$ exists, where $i_m$ represents the modulation magnitude.

$$i_{dqr} = \begin{bmatrix} i_{ar} \\ i_{br} \\ i_{cr} \end{bmatrix} = \begin{bmatrix} (I_p + i_m\cos(\omega_m t + \theta_m))\cos(\omega t + \theta) \\ (I_p + i_m\cos(\omega_m t + \theta_m))\cos\left(\omega t + \theta - \frac{2\pi}{3}\right) \\ (I_p + i_m\cos(\omega_m t + \theta_m))\cos\left(\omega t + \theta + \frac{2\pi}{3}\right) \end{bmatrix} \quad \text{Equation 14}$$

Applying abc-to-dq transformation to Equation 14 yields Equation 15, which is:

$$i_{dq0r} = \begin{bmatrix} i_{ar} \\ i_{br} \\ i_{0r} \end{bmatrix} = T i_{abc} = \frac{\sqrt{6}}{2} \begin{bmatrix} (I_p\cos\theta + i_m\cos(\omega_m t + \theta_m))\cos\theta \\ (I_p\sin\theta + i_m\cos(\omega_m t + \theta_m))\sin\theta \\ 0 \end{bmatrix} \quad \text{Equation 15}$$

As seen in Equation 15, the d and the q quantities ($i_{dr}$ and $i_{qr}$) are no longer constant, and instead include a dc quantity that is constant, plus a sinusoidal modulation term.

It is to be understood that Equations 11-15 are expressed as only single modulation frequencies. Equations 16 and 17 express Equation 15 in multiple modulation frequencies (i.e., ($\omega_{m1}$, $\omega_{m2}$, $\omega_{m3}$, . . . ) with a given modulation magnitude (i.e., $i_{m1}$, $i_{m2}$, $i_{m3}$, . . . ) and corresponding initial phase ($\theta_{m1}$, $\theta_{m2}$, $\theta_{m3}$, . . . ):

$$i_{dq0r} = \begin{bmatrix} i_{ar} \\ i_{br} \\ i_{0r} \end{bmatrix} = T i_{abc} = \frac{\sqrt{6}}{2} A \begin{bmatrix} \cos\theta \\ \sin\theta \\ 0 \end{bmatrix} \quad \text{Equation 16}$$

wherein $A = I_p + i_{m1} \cos(\omega_{m1}t + \theta_{m1}) + i_{m2} \cos(\omega_{m2}t + \theta_{m2}) + \ldots i_{mn} \cos(\omega_{mn}t + \theta_{mn})$     Equation 17

For purposes of simplicity, Equations 16 and 17 may be expressed using only one modulation frequency, $i_m \cos(\omega_m t + \theta_m)$, and the corresponding current dq domain control reference may be expressed in Equation 18 as:

$$i_{dqr} = \begin{bmatrix} i_{dr} \\ i_{qr} \end{bmatrix} = T i_{abc} = \frac{\sqrt{6}}{2} \begin{bmatrix} (I_p\cos\theta + i_m\cos(\omega_m t + \theta_m))\cos\theta \\ (I_p\sin\theta + i_m\cos(\omega_m t + \theta_m))\sin\theta \end{bmatrix} \quad \text{Equation 18}$$

Continuing to refer to FIG. 9, the control reference current value $id_m$ may be sent from the reference calculation block 384 to the error signal block 386. The error signal block 386 may calculate the error signal E. Similar to the embodiment as shown in FIG. 6, the error signal E is based on the difference between the real-time current measurement $i_{dq}$ measured by the current sensor 311 and the control reference current value $i_{dqr}$. The error signal E may be sent to the control module 318.

The control module 318 includes similar logic as the control module 218 shown in FIG. 6. Specifically, similar to the embodiment as shown in FIG. 6, the control module 318 outputs the control duty cycle signal $d_{dq}$ based on the error signal E. The duty cycle signal $d_{dq}$ is first transformed from the dq coordinate system back to the abc coordinate system by a dq-to-abc transformer block 334. The transformed duty cycle signal $d_{abc}$ is then sent to the VSI 350. The transformed duty cycle signal $d_{abc}$ indicates the switching frequency and duty cycle for the semiconductors contained within the VSI 350.

Moreover, similar to the control module 218 the control module 318 also has zero dc gain. Thus, the tracking the dc component C may not be affected by determining current modulation load profiles. In particular, the dc quantity control loop crossover frequency may be relatively low when compared to the angular frequency ω. Thus, those skilled in the art will readily appreciate that the control module 318 may be combined with multiple resonant control modules in parallel without affecting DC quantity control, which corresponds to the fundamental component control of the ALP 330.

Referring generally to the figures, the disclosed programmable AC load provides several advantages and benefits when compared to some of the programmable AC loads currently available. First, the disclosed programmable AC load includes a regenerative mode, which allows for the power from the EUT to be sent back to the utility line instead of dissipating the power from the EUT as heat. Those skilled in the art will readily appreciate that the regenerative mode results in a more efficient, cost-effective testing system. Moreover, the disclosed programmable AC load may also be more suitable for testing environments which have limited heat dissipation capabilities.

In addition to the regenerative mode, the disclosed ALP programmable AC load may utilize an active power electronic circuit, rather than using combinations of passive elements. The programmable AC load may provide a variety of load profile functions to the EUT such as steady-state load profiles, lower harmonic load profiles (the exact harmonic orders depend on the specific topology of the system), transient load profiles, modulation load profiles, higher order harmonic load profiles, and current modulation load profiles. In particular, the disclosed programmable AC load may generate higher order harmonic profiles, where harmonic magnitude and phase may be selected by a user without the need to change any hardware within the testing system. Moreover, multiple harmonics may also be generated. The programmable AC load may also generate higher order harmonic profiles using an approach that does not affect the dc component in the dq domain. Finally, the disclosed programmable AC load may also generate current modulation load profiles as well, without modifying hardware within the testing system.

While the forms of apparatus and methods herein described constitute preferred aspects of this disclosure, it is to be understood that the disclosure is not limited to these precise forms of apparatus and methods, and the changes may be made therein without departing from the scope of the disclosure.

What is claimed is:

1. A programmable alternating current (AC) load in communication with an equipment under test (EUT), the EUT generating an equipment under test voltage, the programmable AC load comprising:
   an active load profiler (ALP) creating current modulation load profiles sent to the EUT, the ALP comprising:
     a voltage source inverter having an AC side and a direct current (DC) side, the AC side of the voltage source inverter in communication with the EUT for receiving the equipment under test voltage; and
     a control module in operative communication with the voltage source inverter of the ALP, the control module sending a control duty signal to the voltage source inverter indicating a switching frequency and a duty cycle of the current modulation load profiles;
   a grid-connected inverter having an AC side and a DC side, the DC side of the grid-connected inverter in communication with the DC side of the voltage source inverter of the ALP, the grid-connected inverter providing a regulated DC voltage source to the voltage source inverter of the ALP; and
   an operational mode selector in communication with the AC side of the grid-connected inverter, the operational mode selector placing the programmable AC load in either a regenerative mode where the equipment under test voltage is sent to a main grid or a dissipative mode where the equipment under test voltage is dissipated by heat.

2. The programmable AC load of claim 1, comprising a voltage sensor placed across output terminals of the EUT for producing a three-phase real-time voltage measurement.

3. The programmable AC load of claim 2, comprising a reference calculation block receiving as input a real-time voltage measurement based on a synchronous rotating domain (dq), wherein the three-phase real-time voltage measurement from the voltage sensor is transformed into the real-time voltage measurement.

4. The programmable AC load of claim 3, wherein the reference calculation block receives a three-phase balanced current control reference value and determines a control reference current value based on the real-time voltage measurement and the three-phase balanced current control reference value.

5. The programmable AC load of claim 4, comprising a user input in communication with the reference calculation block, wherein the three-phase balanced current control reference value is provided by the user input.

6. The programmable AC load of claim 4, wherein the control reference current value is determined by:

$$i_{dq0r} = \begin{bmatrix} i_{ar} \\ i_{br} \\ i_{0r} \end{bmatrix} = T_{iabc} = \frac{\sqrt{6}}{2} A \begin{bmatrix} \cos\theta \\ \sin\theta \\ 0 \end{bmatrix}$$

wherein $i_{dq0r}$ is the control reference current value expressed in a dq0 domain, $\theta$ is phase, $T_{iabc}$ represents a transformation matrix to transform quantities in an abc domain into a dq0 domain, and A represents multiple modulation frequencies with a given modulation magnitude.

7. The programmable AC load of claim 6, wherein A is expressed as:

$$A = I_p + i_{m1} \cos(\omega_{m1}t + \theta_{m1}) + i_{m2} \cos(\omega_{m2}t + \theta_{m2}) + \ldots i_{mn} \cos(\omega_{mn}t + \theta_{mn})$$

wherein $\omega_{m1}$, $\omega_{m2}$, and $\omega_{mn}$ represent multiple modulation frequencies, $i_{m1}$, $i_{m2}$, and $i_{mn}$ represent a given modulation magnitude, $\theta_{m1}$, $\theta_{m2}$, and $\theta_{mn}$ represent a corresponding initial phase, and $I_p$ is a magnitude of a three-phase balanced current control reference $I_{abcr}$.

8. The programmable AC load of claim 4, comprising an error signal block that receives the control reference current value from the reference calculation block, wherein the error signal block determines an error signal based on a difference between a real-time current measurement and the control reference current value and sends the error signal to the control module.

9. The programmable AC load of claim 8, wherein the control module determines the duty cycle of the current modulation load profiles based on the error signal.

10. The programmable AC load of claim 1, wherein the control module has zero dc gain.

11. The programmable AC load of claim 1, wherein the operational mode selector comprises a switching element that places the programmable AC load in either the regenerative mode or the dissipative mode.

12. The programmable AC load of claim 1, comprising a series of dissipative elements that are connected to the grid-connected inverter in the dissipative mode.

13. A method of creating current modulation load profiles by a programmable AC load that is sent to an EUT, the EUT generating an equipment under test voltage, the method comprising:
   sending, by a control module, a control duty cycle to a voltage source inverter, wherein the control duty cycle indicates a switching frequency and a duty cycle of the current modulation load profiles;
   creating the current modulation load profiles sent to the EUT by an ALP, wherein the ALP includes the voltage source inverter;
   providing a regulated DC voltage source to the voltage source inverter of the ALP by a grid-connected inverter; and
   placing the programmable AC load in either a regenerative mode where the equipment under test voltage is sent to a main grid or a dissipative mode where the equipment under test voltage is dissipated by heat by an operational mode selector in communication with the grid-connected inverter.

14. The method of claim 13, comprising placing a voltage sensor across output terminals of the EUT for producing a three-phase real-time voltage measurement.

15. The method of claim 14, comprising:
   transforming the three-phase real-time voltage measurement from the voltage sensor into a real-time voltage measurement that is based on a synchronous rotating domain (dq); and
   receiving as input, by a reference calculation block, the real-time voltage measurement.

16. The method of claim 15, comprising:
receiving, by the reference calculation block, a three-phase balanced current control reference value; and
determining a control reference current value based on the real-time voltage measurement and the three-phase balanced current control reference value.

17. The method of claim 16, comprising:
providing the three-phase balanced current control reference value by a user input.

18. The method of claim 16, comprising determining the control reference current value by:

$$i_{dq0r} = \begin{bmatrix} i_{ar} \\ i_{br} \\ i_{0r} \end{bmatrix} = T_{iabc} = \frac{\sqrt{6}}{2} A \begin{bmatrix} \cos\theta \\ \sin\theta \\ 0 \end{bmatrix}$$

wherein $i_{dq0r}$ is the control reference current value expressed in a dq0 domain, $\theta$ is phase, $T_{iabc}$ represents a transformation matrix to transform quantities in an abc domain into a dq0 domain, and A represents multiple modulation frequencies with a given modulation magnitude.

19. The method of claim 18, wherein A is expressed as:

$$A = I_p + i_{m1} \cos(\omega_{m1}t + \theta_{m1}) + i_{m2} \cos(\omega_{m2}t + \theta_{m2}) + \ldots i_{mn} \cos(\omega_{mn}t + \theta_{mn})$$

wherein $\omega_{m1}$, $\omega_{m2}$, and $\omega_{mn}$ represent multiple modulation frequencies, $i_{m1}$, $i_{m2}$, and $i_{mn}$ represent a given modulation magnitude, $\theta_{m1}$, $\theta_{m2}$, and $\theta_{mn}$ represent a corresponding initial phase, and $I_p$ is a magnitude of a three-phase balanced current control reference $I_{abcr}$.

20. The method of claim 16, comprising:
receiving, by an error signal block, the control reference current value from the reference calculation block;
determining, by the error signal block, an error signal based on a difference between a real-time current measurement and the control reference current value; and
sending the error signal to the control module.

* * * * *